United States Patent
Camus (10) Patent No.: US 10,656,106 B2
(45) Date of Patent: May 19, 2020

(54) SYSTEMS AND METHODS FOR IN SITU HIGH TEMPERATURE X-RAY SPECTROSCOPY IN ELECTRON MICROSCOPES

(71) Applicant: EDAX, Incorporated, Mahwah, NJ (US)

(72) Inventor: Patrick Paul Camus, Pen Argyl, PA (US)

(73) Assignee: EDAX, Incorporated, Mahwah, NJ (US)

( * ) Notice: Subject to any disclaimer, the term of this patent is extended or adjusted under 35 U.S.C. 154(b) by 0 days.

(21) Appl. No.: 16/268,251

(22) Filed: Feb. 5, 2019

(65) Prior Publication Data

US 2019/0242836 A1    Aug. 8, 2019

Related U.S. Application Data

(60) Provisional application No. 62/627,037, filed on Feb. 6, 2018.

(51) Int. Cl.

| | |
|---|---|
| *G01N 23/2252* | (2018.01) |
| *H01J 37/20* | (2006.01) |
| *H01J 37/28* | (2006.01) |
| *H01J 37/244* | (2006.01) |
| *G01N 1/44* | (2006.01) |

(52) U.S. Cl.
CPC ............ *G01N 23/2252* (2013.01); *G01N 1/44* (2013.01); *H01J 37/20* (2013.01); *H01J 37/244* (2013.01); *H01J 37/28* (2013.01); *H01J 2237/2442* (2013.01); *H01J 2237/2807* (2013.01)

(58) Field of Classification Search
CPC ....... G01N 23/2252; G01N 1/44; H01J 37/20; H01J 37/244; H01J 37/28; H01J 2237/2442; H01J 2237/2807
USPC ................ 250/305, 306, 307, 309, 310, 311, 250/440.11, 441.11, 442.11, 443.1
See application file for complete search history.

(56) References Cited

U.S. PATENT DOCUMENTS

| | | | | |
|---|---|---|---|---|
| 4,804,853 | A * | 2/1989 | Borden | G01N 15/0205 250/574 |
| 5,479,024 | A * | 12/1995 | Hillner | B82Y 20/00 250/458.1 |
| 2006/0144091 | A1* | 7/2006 | Kato | C03B 5/021 65/135.6 |
| 2007/0176104 | A1* | 8/2007 | Geneczko | G01J 3/36 250/338.1 |
| 2017/0047371 | A1* | 2/2017 | Lee | H01L 27/14643 |

* cited by examiner

*Primary Examiner* — Nicole M Ippolito
(74) *Attorney, Agent, or Firm* — Ray Quinney & Nebeker P.C.; John O. Carpenter (57) ABSTRACT

In some embodiments, a system for collecting information from a sample includes a sample stage and one or more signal detectors. The sample stage includes a heating element, and the heating element is capable of heating at least a portion of the sample stage to at least 100 Celsius. The one or more signal detectors has a detection material with a silicon nitride window positioned between the detection material and the sample stage.

20 Claims, 4 Drawing Sheets

SYSTEMS AND METHODS FOR IN SITU HIGH TEMPERATURE X-RAY SPECTROSCOPY IN ELECTRON MICROSCOPES

CROSS-REFERENCE TO RELATED APPLICATIONS

This application claims the benefit of U.S. Provisional Patent Application No. 62/627,037, filed on Feb. 6, 2018, which is hereby incorporated by reference in its entirety.

BACKGROUND OF THE DISCLOSURE

Data collection systems are used for material analysis and microanalysis of a variety of material properties including chemical, structural, mechanical, crystallographic, or other information. For example, Energy Dispersive Spectrometry ("EDS") has grown into a robust analytic technique for the measurement of material properties. EDS is an analytical technique performed in a scanning electron microscope ("SEM") or transmission electron microscope ("TEM") in a low pressure or near vacuum environment. A sample is positioned beneath a column housing an electron source. The electron source may be any suitable source, such as a tungsten filament, thermal field emission, or $LaB_6$ electron source. The electron source may emit electrons that are directed in a beam through the column and toward a sample chamber. The sample chamber may be connected to the column and allow a sample to be held in line with the electron beam for imaging and/or sampling. The sample may have an unprepared surface allowing sampling of the exposed surface (such as particles or broken and/or cut surfaces) or a prepared surface that is substantially flat. Non-conductive samples may be made more conductive by deposition of a conductive layer over at least part of the surface in order to provide a conductive path to ground. For example, carbon layers or gold layers sputtered onto the surface of a sample can provide a conductive layer that dissipates charge from the sample to the sample stage or other ground within the sample chamber.

Figure 1:
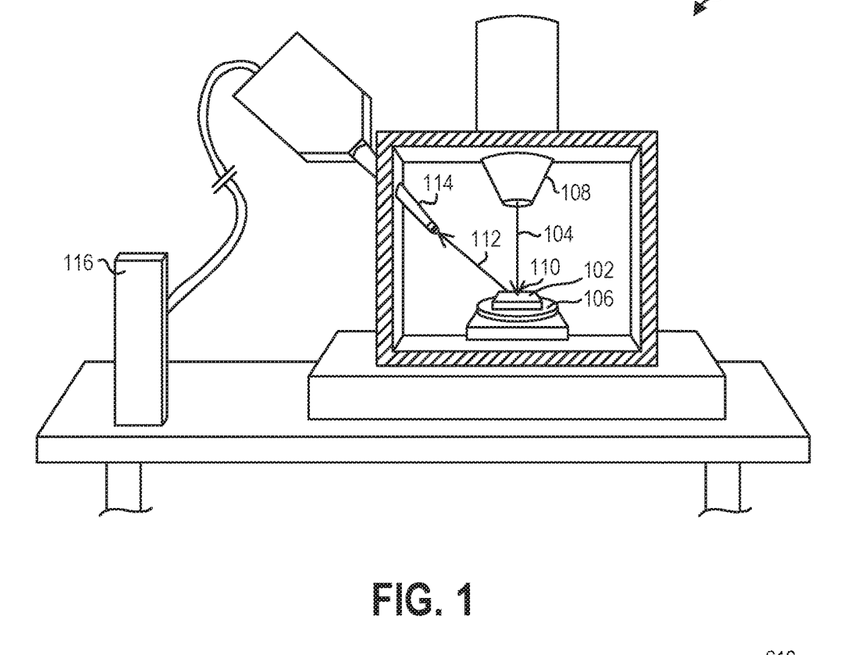
FIG. 1 is a partial cutaway side view of a system for collecting data from a sample, according to some embodiments of the present disclosure.

Referring now to FIG. 1, conventional EDS may be conducted in a data collection system 100 by positioning a sample 102 in line with an energy beam 104. The surface of the sample 102 may be oriented perpendicularly to the energy beam 104 or may be oriented at an angle not perpendicular to the energy beam 104. For a sample 102 with an uneven surface, tilting of the sample provides line-of-sight to features that are otherwise inaccessible by the energy beam 104. The position of the sample 102 relative to the beam 104 may be achieved by tilted a sample stage 106 or by providing a sample holder (not shown) having non-parallel surfaces mounted to the sample stage 106 or a combination of the two.

Lenses, such as electromagnetic lenses, may focus and/or deflect the energy beam 104 at different working distances (focal length beneath a lowest point of the column 108) and/or locations on the sample 102. A "scan" of the data collection system 100 may include construction of an image of a surface of the sample 102 by rastering the beam 104 through a predetermined range of positions and/or deflections of the beam 104. A combination of a signal detector 114 and rastering of the beam 104 allows for the construction of X-ray count maps of a portion of the sample 102.

The interaction of the energy beam 104 and the sample 102 causes the atoms of the sample 102 to become excited. When an electron or electrons of an atom relaxes to a lower-energy ground state, the atom will emit energy in the form of an X-ray. The X-ray will have a particular energy that correlates to the state of the electron that emitted the X-ray. For example, electrons in the K energy level of the atom will emit an X-ray with a different energy than electrons in the L energy level. The X-rays will also vary in energy depending on the element emitting the X-ray. For example, electrons of the K energy level in aluminum will emit X-rays of different energy than the electrons of the K energy level in iron. Measurement of the X-ray energy allows for differentiation of elements excited by the energy beam 104. The relative quantity of X-ray counts in a given period of time indicates relative concentration of those elements in the sample 102 excited by the energy beam 104.

The signal detector 114 includes a detection surface that converts X-rays into a voltage signal. The voltage signal is the provided to a pulse processor that measures the signal and passes them to an analyzer, which will then display the data and allow further analysis by a user. The detection material can be a semiconductor that is cooled to low temperatures, for example, by liquid nitrogen or by Peltier cooling. EDS detectors include silicon-lithium ("Si(Li)") detectors and newer silicon drift detectors ("SDDs").

SUMMARY

In some embodiments, a system for collecting information from a sample includes a sample stage and one or more signal detectors. The sample stage includes a heating element, and the heating element is capable of heating at least a portion of the sample stage to at least 100 Celsius. The one or more signal detectors has a detection material with a silicon nitride window positioned between the detection material and the sample stage.

In some embodiments, a method of collecting information from a sample includes positioning a sample in a chamber of a data collection system, heating the sample to at least 100° C., and directing an energy beam at the sample. The energy beam then induces emitting secondary X-rays from the sample based at least partially on the energy beam. The method further includes emitting photons from the heated sample and detecting the secondary X-rays with a signal detector while reflecting at least a portion of the photons with a reflective coating on a silicon nitride window of the signal detector.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

This disclosure generally relates to data collection devices, systems, and methods for collecting information from a sample. More specifically, the present disclosure relates to improved collection and detection of X-rays emitted from a sample at an elevated temperature excited by an energy source.

Material properties may be different at different temperatures and pressures. In some examples, the atomic bonds of a material may move when the sample is heated, such as when a sample experiences recrystallization and/or grain growth. In other examples, a sample may experience elemental migration when the sample is heated, allowing atoms of particular element to move to a lower energy position within the material. In yet other examples, a sample may undergo a phase change upon exposure to increased temperature. In further examples, a sample may experience a chemical reaction and/or alloying process at an elevated temperature (such as along a boundary between materials). As many of these changes to materials may occur during usage of the materials, such as the elevated temperatures experienced by a metal bearing surface, it may be beneficial to evaluate such material changes at elevated temperature in a controlled environment.

In some embodiments, a data collection system may include one or more signal detectors that allow for the detection and measurement of characteristic signals from a sample. The data collection system may include one or more directed energy sources to excite the sample and produce characteristic signals, such as secondary electrons, backscatter electrons, secondary X-rays, Auger electrons, and other signals. Characteristic X-rays may be emitted from the sample upon excitation, and the X-rays may have an energy related to the element from which the X-rays are emitted. Heating a sample may introduce an additional excitation source to the sample, causing the sample to emit photons or other energy signals. A signal detector that may selectively detect and measure the characteristic X-rays despite exposure to elevated temperatures and the associated photons and/or other energy signals associated with an elevated temperature sample may be desirable.

FIG. 1 illustrates a data collection system 100 having a sample 102 located in line with a beam 104. While the present example of a data collection system 100 is an SEM and an electron beam, the present disclosure may be applicable to other analysis techniques, such as those utilizing focused and/or broad energy beams from an energy beam source such as an X-ray source, microwave source, ion source, proton source, gamma source, visible light source, laser source, any other directed energy source, or combinations thereof. The sample 102 may be located on a sample stage 106. In some embodiments, the sample stage 106 may be movable relative to the beam 104 to alter the location of the beam 104 relative to the sample 102. In other embodiments, optics in a column 108 of the data collection system 100, such as scan coils, may move (i.e., deflect) the beam 104 relative to the sample stage 106 to alter the location of the beam 104 relative to the sample 102. In other embodiments, both the sample stage 106 may be movable relative to the beam 104 and the beam 104 may move (i.e., deflect) relative to the sample stage 106.

The data collection system 100 may provide an electron beam 104 that is accelerated towards and focused at the sample 102. The electron beam may have a variety of accelerating voltages and a variety of beam currents. The accelerating voltage may affect the energy of the X-rays generated during interaction of the electron beam 104 with the sample 102. The beam current may affect the quantity of X-rays generated during interaction of the electron beam with the sample 102.

The beam 104 may excited a localized sampling location 110 on the sample 102. The excited sampling location 110 may, subsequently, emit one or more characteristic signals 112 toward a signal detector 114. The signal detector 114 may detect the characteristic signals 112 and, in some embodiments with the help of a computing device 116, may measure the energy or other properties of the characteristic signals 112. In some embodiments, the signal detector 114 and/or computing device 116 may subsequently report or present the measured energy of the characteristic signals 112 to a user, for example, through a display, a monitor, a report template, or readable media.

In some embodiments, the sample stage 106 may include a heating element that may heat the sample stage 106 and/or the sample 102 to an elevated temperature. For example, the heating element may be configured to heat the stage 106 and/or the sample 102 to an elevated temperature of at least 100 Celsius (° C.). In other examples, the heating element may be configured to heat the stage 106 and/or the sample 102 to an elevated temperature of at least 500° C. In yet other examples, the heating element may be configured to heat the stage 106 and/or the sample 102 to an elevated temperature of at least 1000° C. In further examples, the heating element may be configured to heat the stage 106 and/or the sample 102 to an elevated temperature of at least 1500° C. In yet further examples, the heating element may be configured to heat the stage 106 and/or the sample 102 to an elevated temperature of at least 2000° C. In at least one example, the heating element may be configured to heat the stage 106 and/or the sample 102 to an elevated temperature of at least 3000° C. In some embodiments, the heating element may be a resistive heating element.

Figure 2:
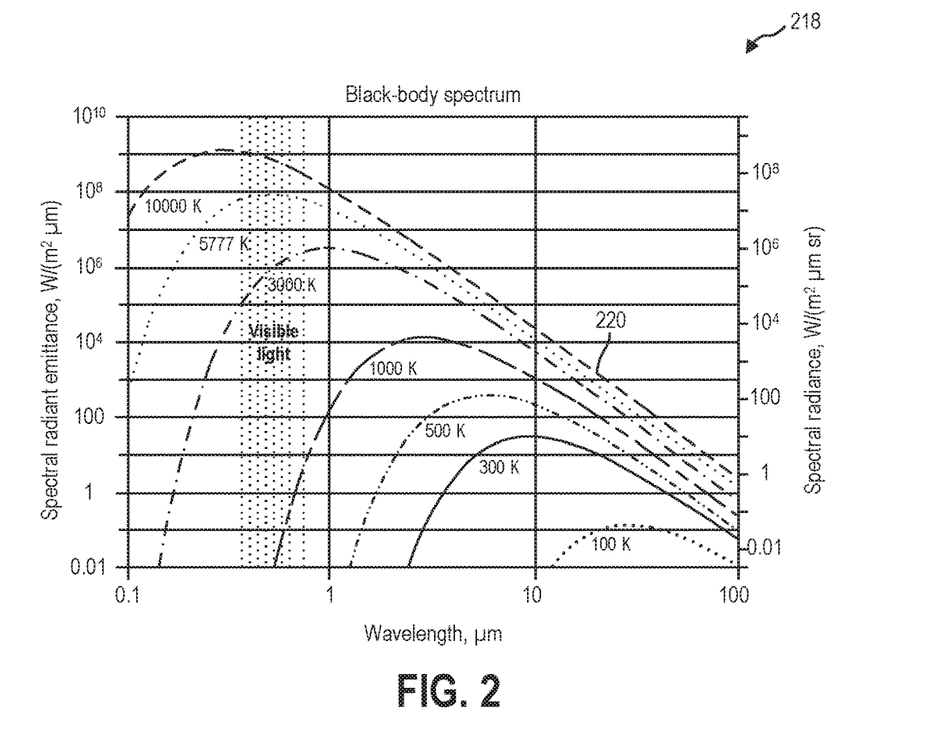
FIG. 2 is a chart illustrating emission curves of black body radiators.

A sample 102 and/or sample stage 106 heated to the elevated temperature may emit photons. For example, FIG. 2 is a chart 218 illustrating a plurality of emission curves 220 of a black body radiator. A black body radiator may emit energy at various quantities and wavelengths dependent, at least partially, upon the temperature of the object. In at least one example, a sample heated to 1000 Kelvin (727° C.) may have a peak spectral emission at approximately 2.89 micrometers (μm). In other examples, a sample heated to 3000 K (2727° C.) may have a peak spectral emission at approximately 0.97 μm and approaching the visible spectrum of light.

The photons emitted from a sample and/or sample stage at an elevated temperature may be in the infrared wavelength range, the visible wavelength range, or the ultraviolet wavelength range. The emission of photons may be detected by the signal detector of FIG. 1, however, and may interfere with the detection and measurement of the characteristic signal.

Figure 3:
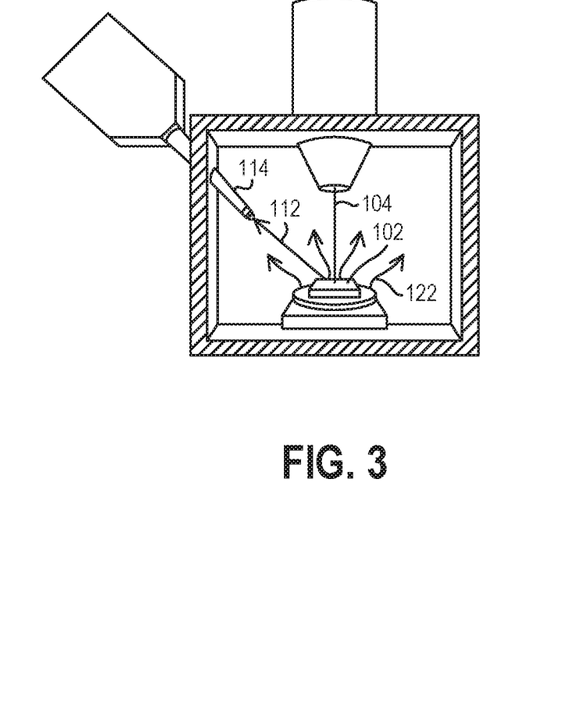
FIG. 3 partial cutaway side view of a system for collecting data from a sample at an elevated temperature, according to some embodiments of the present disclosure.

FIG. 3 is a side view of the data collection system 100 of FIG. 1 in operation. The beam 104 may excite a sampling location 110 of the sample 102, and the excited material at the sampling location 110 may emit a characteristic signal 112. The characteristic signal may be detected by the signal detector 114 to characterize the sample 102. However, a sample 102 and/or sample stage 106 at an elevated temperature may emit photons 122 in substantially all directions. A black-body radiator is a Lambertian radiator, meaning the photons radiate equally in all directions from the source, irrespective of orientation of the surface.

Figure 4:
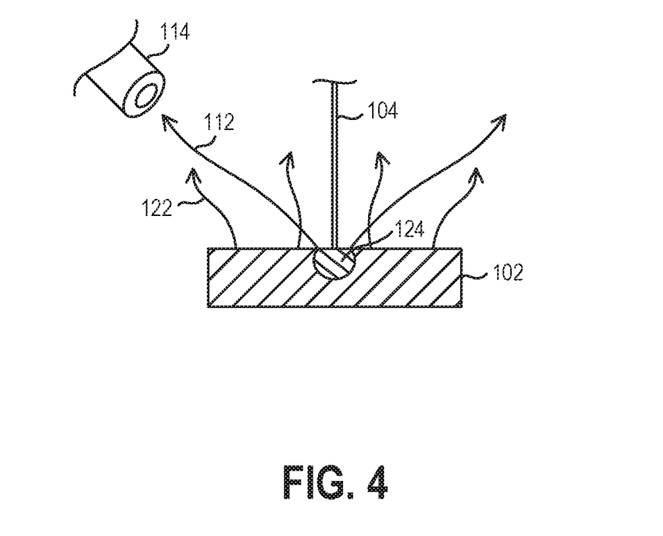
FIG. 4 is a detail view of emission sources from a sample at an elevated temperature during data collection, according to some embodiments of the present disclosure.

Therefore, as shown in the detail view of FIG. 4, a positioning of the signal detector 114 relative to a sample 102 may be insufficient to avoid the photon 122 emission. The electron beam 104 consists of the electrons from an electron source accelerated toward the sample. As used herein "electron source" should be understood to refer to any emitting source of electrons, such as a thermal field emission gun ("FEG") source, a cold FEG source, a tungsten filament source, a LaB$_6$ source, or other electron emission sources. The electrons emitted by the electron source may be accelerated through a magnetic field to an energy in a range having upper and lower values including any of 0.5 kilovolts ("kV"), 1 kV, 5 kV, 10 kV, 15 kV, 20 kV, 25 kV, 30 kV, or any value therebetween. For example, the incident electrons may have an incident energy between 0.5 kV and 30 kV. In another example, the incident electrons may have an incident energy between 1 kV and 20 kV.

The electron beam 104 may contact the sample 102 as an approximate point source, but interact with the sample 102 in an interaction volume 124 at the sampling location. As used herein, "point source" should be understood to refer to an approximation of a singular origin point for the energy. While the electron beam may be practically limited to have an incident diameter greater than about 3 nanometers ("nm"), the electrons of the electron beam 104 will scatter upon contact with the sample 102, producing a larger interaction volume 124. The interaction volume 124 is the volume in which the electrons of the electron beam 104 will interact with the sample and impart energy to the atoms of the sample 102.

The electron beam 104 may transfer energy to the sample 102 by exciting the atoms of the sample 102. The incident electrons of the electron beam 104 may transfer energy to and/or displace electrons from the atoms of the sample 102 causing at least some of the atoms of the sample 102 to be in an unstable or excited state. When the electrons of the excited atoms return to a lower-energy ground state, the excess energy is released as an X-ray or other characteristic signal 112 that is emitted from the sample 102. The energy of the characteristic signal 112 is correlated to the atomic composition of the excited atom. For example, the energy of the X-ray emitted is affected by the electron orbitals of the atom and the nuclear composition (i.e., element). The energy of an X-ray emitted by the K-energy level of an aluminum atom will be different than the energy of an X-ray emitted by the K-energy level of a titanium atom. Further, the energy of an X-ray emitted by the K-energy level of an aluminum atom will be substantially constant.

The spectrum of X-ray energies may represent at least some of the elements present in a sample. The spectrum may include a plurality of energy channels that each contain a number of X-ray counts corresponding to the quantity of X-rays detected by the EDS detector within the energy channel. The EDS detector and sample may be connected to a scanning electron microscope ("SEM") during operation. The X-rays detected by the EDS detector may be at least partially dependent upon the conditions of the SEM during collection of X-rays.

An energy dispersive spectrometry ("EDS") detector may detect X-rays and measure the energy and quantity of the detected X-rays. For example, an EDS detector may have a detection surface, such as a semiconductor, that may react when an X-ray emitted by a sample contacts the detection surface. The detection surface may generate a voltage signal when an X-ray strikes the detection surface. The voltage signal may be measured to calculate the energy of the incident X-ray. The energy of the incident X-ray correlates to the atom of the sample that emitted the X-ray.

Figure 5:
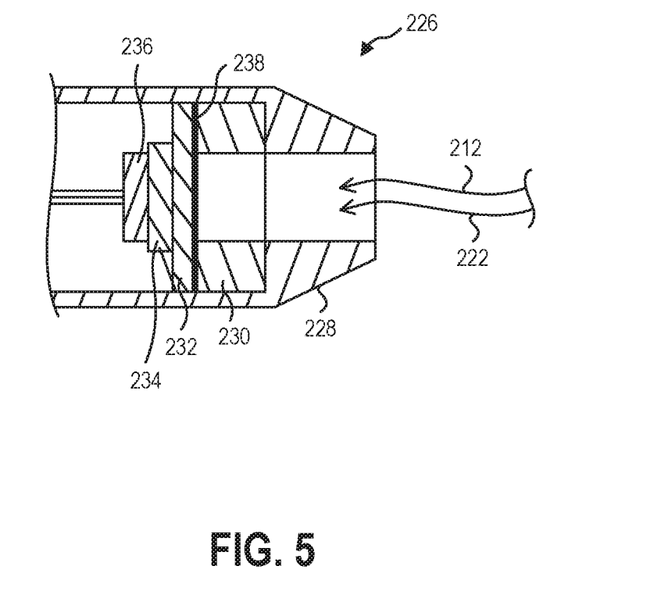
FIG. 5 is a side cross-sectional view of an X-ray detector tip, according to some embodiments of the present disclosure.

FIG. 5 illustrates a signal detector 216 configured to be attached to an electron microscope. The detector 216 has a detection tip 226 that is configured to be positioned in a chamber of the electron microscope proximate to a sample 102 that is excited by an excitation beam 104 as shown in FIG. 4.

The detection tip 226 may collect and detect the characteristic X-rays 212 by the interaction of the X-rays 212 with a detection material positioned in the detection tip 226. The X-ray 212 may be absorbed by the detection material and impart energy to the detection material. When an incident X-ray 212 strikes the detection material in the detection tip 226, the energy of the X-ray 212 is absorbed by a series of ionizations within the semiconductor detection material to create a number of electron-hole pairs in the detection material. An electron-hole pair is created for every 3.6 eV of incoming radiation. Thus, for example, a nickel Kα X-ray photon (7,471 eV) will produce a current of 2,075 electrons.

The detection tip 226 has a detection material 234. In some embodiments, the detection tip 226 may include a collimator 228, an electron trap 230, and/or a window 232 through which the characteristic X-rays 212 from the sample may be received before contacting a detection material 234. In some embodiments, the window 232 may have a coating 238 thereon.

The detection tip 226 may include an electron trap 230. The electron trap 230 may provide a magnetic field forward of the detection material 234 to deflect any electrons from the sample, electron beam, or chamber. Errant electrons may introduce error into the signal from the X-rays 212 and may reduce the accuracy of X-ray measurement and/or sample identification.

A bias voltage is applied between electrical contacts on the front face and back of the detection material and urges the electrons and holes to the opposite electrodes, producing a charge signal, the size of which is proportional to the energy of the incident characteristic X-ray. By measuring the induced current, for example with a field effect transistor (FET) 236 and/or a pulse processor, the energy of the collected X-ray 212 may be identified.

X-rays 212 of differing energies may approach the detection material 234. A higher energy X-ray 212 will penetrate further into the detection material 234 before interacting with the detection material 234. For example, a lower energy X-ray may penetrate into the detection material a first distance from the outer surface of the detection material, and a higher energy X-ray may penetrate into the detection material a second distance from the outer surface of the detection material that is greater than the first distance.

The X-rays may generate an electron-hole pair cloud as the X-rays move through the detection material. The current induced in the detection material and FET 236 may allow for the measurement of X-ray energies. However, electron trap 230 may be ineffective at preventing photons 222 from entering the detection tip 226 and interacting with the detection material 234. As the photons 222 may be relatively high-energy relative to the X-rays 212, the interactions of the photons 222 with the detection material 234 of the signal detector may overwhelm any detection and/or measurement of the X-rays 212.

A coating 238 may be applied to the window 232 to reflect the photons 222 while remaining substantially transparent to the incident X-rays 212. For example, a substantially transparent coating 238 may allow for at least 95% of the X-rays 212 to pass through and interact with the detection material 234. In other examples, a substantially transparent coating 238 may allow for at least 98% of the X-rays 212 to pass through and interact with the detection material 234. In yet other examples, a substantially transparent coating 238 may allow for at least 99% of the X-rays 212 to pass through and interact with the detection material 234.

A conventional detection material may include a silicon semiconductor material. In some embodiments, the silicon may be doped with one or more dopant materials, such as lithium, to compensate for impurities in the silicon. In other embodiments, the silicon may be a highly pure silicon wafer. For example, a silicon drift detector (SDD) utilizes a silicon wafer of high purity with a plurality of ring electrodes to "drift" charge carriers to a central collection electrode to measure the current.

Figure 6:
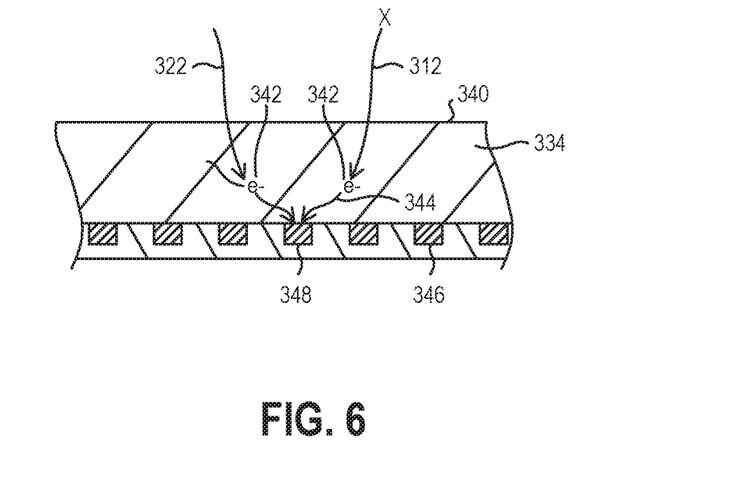
FIG. 6 is a side cross-sectional schematic view of a conventional X-ray detection material.

FIG. 6 illustrates an embodiment of a detection event in a conventional detection material 334. In some embodiments, the detection material 334 may be a semiconductor material, such as a silicon semiconductor material. In other embodiments, the semiconductor material may be a compound semiconductor material. For example, the compound semiconductor material may include two elements in substantially equal proportions. The compound semiconductor material may include cadmium. In other examples, the compound semiconductor material may include tellurium. In yet other examples, the compound semiconductor material may include zinc.

The detection material 334 may have an amorphous microstructure. In other embodiments, the detection material 334 may have a crystalline microstructure. For example, the detection material 334 may include a microstructure with randomly oriented grains. In another example, the detection material 334 may include a microstructure with grains having a preferred orientation. In yet other examples, the detection material 334 may be a single crystal crystalline wafer.

In a detection event, an X-ray 312 may penetrate into the detection material 334 from an outer surface 340. The X-ray 312 may interact with the detection material 334 to transfer energy to the atoms of the detection material by creating electron-hole pairs. The electrons 342 that are mobilized by the interaction of the X-ray 312 may move along a drift path 344 through the detection material 334 based on an electric field from one or more drift rings 346. The electrons 342 may move along the drift path 344 toward a collection anode 348.

Similarly, the photon 322 may interact with the semiconductor detection material 334 and mobilize electron-hole pairs. The electrons 342 may, similarly, move along a drift path 344 toward a collection anode 348. The electrons 342 and associated current generated by the photons 322 may interfere with the detection and measurement of the electrons 342 mobilized by the X-rays 312. Additionally, the photons 322 may heat and/or damage the detection material 334 or other portions of the detection tip of the signal detector.

Figure 7:
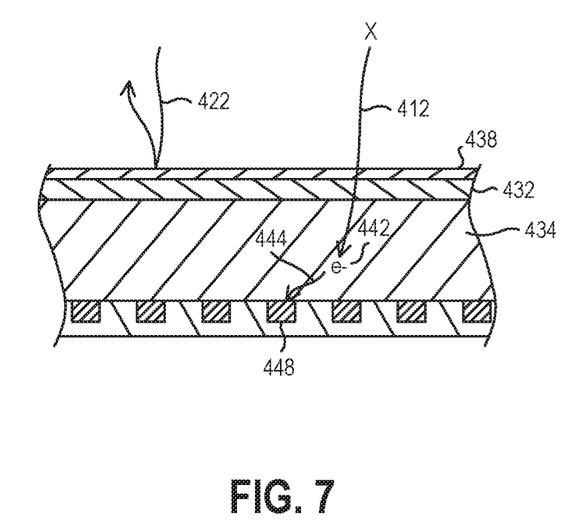
FIG. 7 is a side cross-sectional schematic view of an X-ray detection material, according to some embodiments of the present disclosure.

FIG. 7 is a side cross-sectional view of an embodiment of a detection event in a detection material of the present disclosure. A detection material 434 may have a window 432 with a coating 440. In some embodiments, a window 432 may include an inorganic material. For example, the window 432 may include silicon. In other examples, the window 432 may include a silicon compound. In yet other examples, the window 432 may include a silicon nitride compound. In at least one example, the window 432 may include a $Si_3N_4$ compound. A silicon nitride window 432 may exhibit increased durability relative to an organic or polymer window.

The coating 438 positioned on an outer surface of the window 432 may be substantially transparent to an X-ray or other characteristic signal 412 and allow the X-ray or other characteristic signal 412 to interact with the detection material 434. The resulting mobilized electrons 442 may be collected at the collection anode 448. The coating 438 may be substantially opaque and/or reflective to incident photons 422. For example, the coating 438 may absorb or reflect at least 95% of the incident photons 422. In other examples, the coating 438 may absorb or reflect at least 98% of the incident photons 422. In yet other examples, the coating 438 may absorb or reflect at least 99% of the incident photons 422.

In some embodiments, an absorptive coating 438, such as beryllium may increase in temperature from exposure to the photons 422. In other embodiments, a reflective coating 438 may limit the absorption and heating associated with the absorption of the photons 422, further protecting the coating 438, window 432, and detection material 434 from the incident photons 422.

Figure 8:
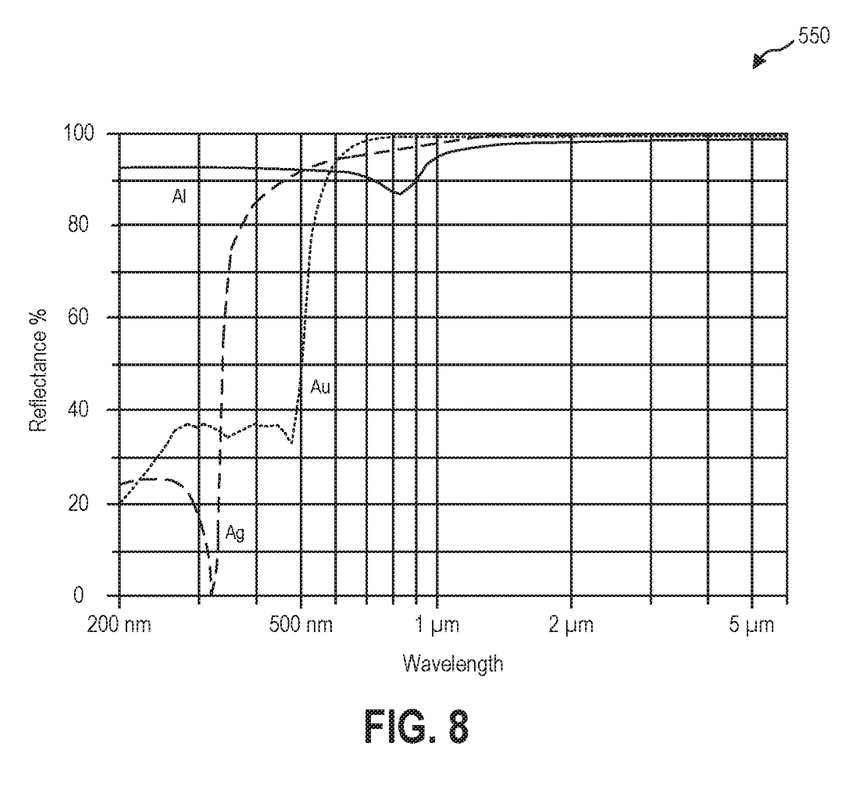
FIG. 8 is a chart illustrating example reflectivities of different coating materials relative to photon wavelength, according to some embodiments of the present disclosure.

FIG. 8 is a chart 550 illustrating the reflectance of example coating materials. In some embodiments, a reflective coating may limit the absorption of photons, but the reflectivity of coatings may be related to the wavelength of the incident photons. For example, a sample approximated as a black body radiator may have a peak radiance depending upon the temperature of the sample, but may emit photons in a broader range. As such, a coating with a wide wavelength range of reflectivity may be advantageous. For example, aluminum may have a reflectivity of 85% or greater from about 200 nm wavelength of incident photons through a 5 µm wavelength of incident photons. In comparison, a gold coating may have a lower reflectivity than aluminum at wavelengths shorter than about 570 nm, while having a higher reflectivity than aluminum at wavelengths longer than 570 nm. In yet other examples, a silver coating may exhibit lower reflectivity than aluminum at wavelengths shorter than about 540 nm, while having a higher reflectivity than aluminum at wavelengths longer than 540 nm, and may exhibit higher reflectivity than gold at wavelengths longer than about 340 nm, while having a lower reflectivity than aluminum at wavelengths longer than 600 nm.

In some embodiments, the coating may have a thickness in a range having an upper value, a lower value, or upper and lower values including any of 50 nm, 100 nm, 150 nm, 200 nm, 250 nm, 300 nm, 350 nm, 400 nm, or any values therebetween. For example, a coating may have a thickness greater than 50 nm. In other examples, a coating may have a thickness less than 400 nm. In yet other examples, a coating may have a thickness between 50 nm and 400 nm. In further examples, a coating may have a thickness between 100 nm and 350 nm. In at least one example, a coating may have a thickness between 200 nm and 300 nm.

A metal and/or reflective coating on a silicon nitride window may allow for signal detector, such as an EDS detector, to be positioned closer to a heated sample than a non-reflective coating or no coating. For example, an uncoated window may increase in temperature much more and/or faster than a coated window. Additionally, a polymer window may soften and/or fail at a much lower temperature than a silicon nitride window. In some embodiments, a signal detector including a silicon nitride window with a reflective coating according to the present disclosure may be positioned a distance from a heated sample that is less than 50 millimeters (mm). In other embodiments, a signal detector including a silicon nitride window with a reflective coating according to the present disclosure may be positioned a distance from a heated sample that is less than 40 millimeters (mm). In yet other embodiments, a signal detector including a silicon nitride window with a reflective coating according to the present disclosure may be positioned a distance from a heated sample that is less than 30 millimeters (mm).

While the present disclosure may describe one or more embodiments of a detector in relation to an electron beam, it should be understood that the present disclosure may be applicable to material analysis, imaging, testing, or combinations thereof including an X-ray source, microwave source, ion source, proton source, gamma source, visible light source, laser source, or any other directed energy source. In some embodiments, the energy source may be a focused beam energy source, such as one providing a focused electron beam, X-ray beam, ion beam, etc. For example, a focused beam may be a beam that may have an incident diameter at a sample surface of 5 microns or less.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

I claim:

1. A system for collecting information from a sample, the system including:
   a sample stage having a heating element therein, the heating element configured to heat at least a portion of the sample stage to at least 100 Celsius (° C.); and
   one or more signal detectors, the one or more signal detectors having a silicon nitride window positioned between the sample stage and a detection material, the silicon nitride window having a reflective coating positioned thereon.

2. The system of claim 1, wherein the reflective coating is at least 85% reflective between 550 nanometers (nm) and 6 micrometers (μm).

3. The system of claim 1, wherein the reflective coating is at least 85% reflective between 200 nm and 1 μm.

4. The system of claim 1, wherein the one or more signal detectors includes an electron trap.

5. The system of claim 1, wherein the one or more signal detectors is a silicon drift detector.

6. The system of claim 1, wherein the one or more signal detectors includes a compound semiconductor X-ray detection material.

7. The system of claim 1, wherein the reflective coating includes aluminum.

8. The system of claim 1, wherein the reflective coating includes gold.

9. The system of claim 1, wherein the silicon nitride window is positioned less than 50 mm from a portion of the sample stage.

10. The system of claim 1, wherein the heating element is configured to heat at least a portion of the sample stage to at least 1000° C.

11. The system of claim 1, wherein the reflective coating has a thickness greater than 500 Angstroms.

12. A method for collecting information from a sample, the method including:
    positioning a sample in a chamber of a data collection system;
    heating the sample to at least 100° C.;
    directing an energy beam at the sample;
    emitting secondary X-rays from the sample based at least partially on the energy beam;
    emitting photons from the sample after heating;
    detecting the secondary X-rays with a signal detector; and
    reflecting at least a portion of the photons with a reflective coating on a silicon nitride window of the signal detector.

13. The method of claim 12, wherein heating the sample includes increasing a temperature of a sample stage to at least 1000° C.

14. The method of claim 13, wherein the sample stage includes a resistive heating element.

15. The method of claim 12, wherein positioning the sample in a chamber includes positioning the sample less than 50 mm from the silicon nitride window.

16. The method of claim 12, wherein reflecting a portion of the photons includes reflecting at least 85% of the photons.

17. The method of claim 12, wherein the reflective coating includes aluminum.

18. The method of claim 12, further comprising measuring an energy of the secondary X-rays.

19. The method of claim 18, further comprising reporting the energy of the secondary X-rays to a user.

20. The method of claim 12, wherein the energy beam is an electron beam.

* * * * *